United States Patent [19]
Ogata

[11] Patent Number: 5,321,734
[45] Date of Patent: Jun. 14, 1994

[54] FREQUENCY MULTIPLIER

[75] Inventor: Yukihisa Ogata, Tokyo, Japan

[73] Assignee: NEC Corporation, Japan

[21] Appl. No.: 874,051

[22] Filed: Apr. 24, 1992

[30] Foreign Application Priority Data

May 16, 1991 [JP] Japan .................................. 3-111366

[51] Int. Cl.⁵ ........................ H03K 3/86; H03K 5/26
[52] U.S. Cl. ..................... 377/47; 328/112; 328/110; 328/66; 328/20; 307/514; 307/517; 307/601
[58] Field of Search ................ 328/20, 138, 140, 112; 377/47; 307/514, 517, 601

[56] References Cited

U.S. PATENT DOCUMENTS

| | | | |
|---|---|---|---|
| 3,305,732 | 2/1967 | Grossman et al. | 328/138 |
| 3,737,789 | 6/1973 | McCoy et al. | 328/138 |
| 3,753,130 | 8/1973 | Pezzutti | 328/138 |
| 4,596,954 | 6/1986 | Haque | 328/120 |
| 4,777,448 | 10/1988 | Satoh | 377/47 |

Primary Examiner—John S. Heyman
Attorney, Agent, or Firm—Laff, Whitesel, Conte & Saret

[57] ABSTRACT

According to the frequency multiplier of the present invention, an output clock signal of multiplied frequency is emitted from an exclusive NOR circuit which enters an input clock signal and a signal obtained by delaying the input clock signal via a first delay circuit. To the first delay circuit, second and third delay circuits are sucessively cascaded to delay the input clock signal. A circuit which comprises two flip-flops is supplied with the input clock signal and the output of the third delay circuit to emit a set signal when the rise in output of the third delayed circuit becomes faster than the fall of the input clock signal due to change in the delay time caused by the external conditions. Further, another circuit, which also comprises two flip-flops, is supplied with the input clock signal and the output of the second delay circuit, and emits a set signal when the rise in output of the second delay circuit becomes more delayed than the fall of the input clock signal due to the above change in the external conditions. These set signals can operate a blocking flip-flop circuit to block the output clock signal so that the fluctuation of the duty factor of the output clock signal, due to the change of the delay time of the first delay circuit, may be restricted within a predetermined range.

5 Claims, 10 Drawing Sheets

FREQUENCY MULTIPLIER

BACKGROUND OF THE INVENTION

1. Field of the Invention

The present invention relates to a frequency multiplier, and particularly to a frequency multiplier for multiplying the frequency of an input signal by utilizing one or more delay circuits and an exclusive logic circuit.

2. Description of the Prior Art

Figure 1:
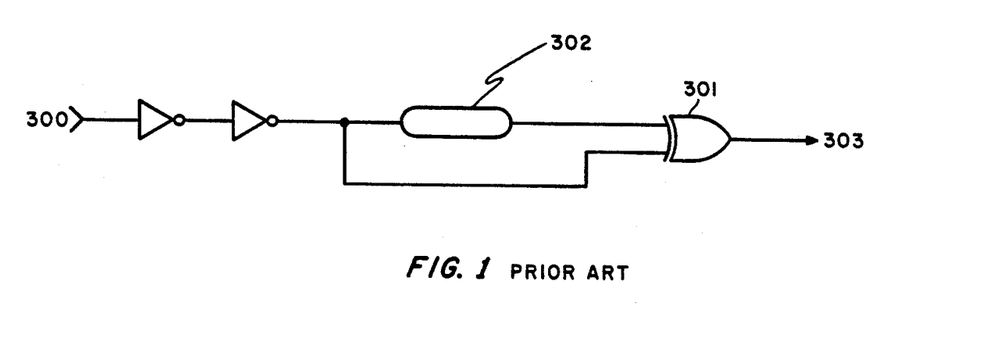
FIG. 1 is a circuit diagram illustrating a specific arrangement of a conventional frequency multiplier.

FIG. 1 is a circuit diagram illustrating the arrangement of a conventional frequency multiplier of this kind, in which input clock signal 300 and an output of delay circuit 302 for delaying signal 300 are utilized to obtain output clock signal 303 whose frequency is doubled by means of exclusive OR circuit 301.

The duty factor (the ratio of the H level period of time of output clock signal 303 to its single cycle time) of output clock signal 303 for the above frequency multiplier is determined by the delay time of the delay circuit.

Figure 2:
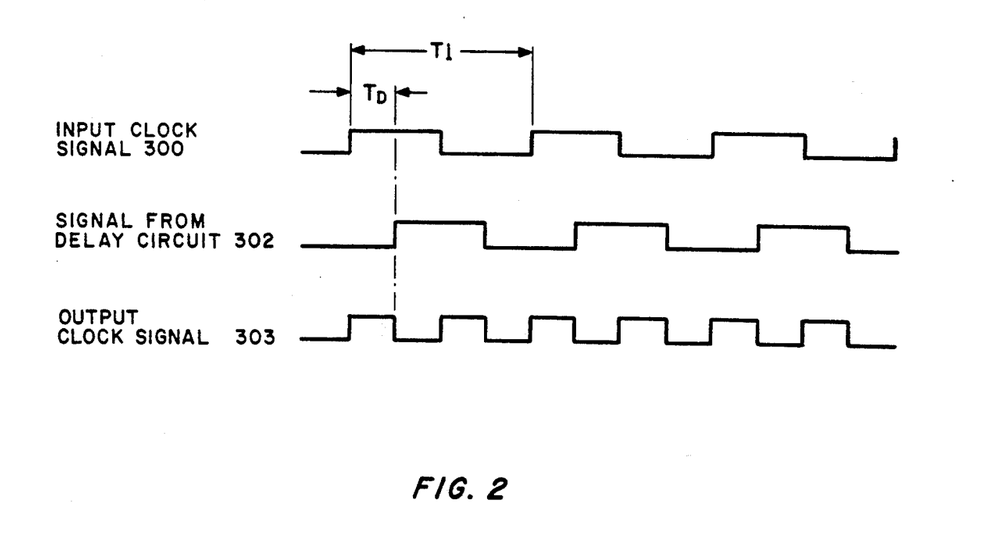
FIG. 2 is a timing chart for each signal when the duty factor of the output clock signal is 50% in the frequency multiplier of FIG. 1.

FIG. 2 is a timing chart illustrating the relationship between input clock signal 300, the output signal of delay circuit 302 and output clock signal 303. In order to set the duty factor of output clock signal 303 to 50%, as shown in the same figure, assuming that the cycle and the duty factor of input clock signal 300 are $T_i$ and 50%, respectively, it is necessary to set delay time $T_D$ of delay circuit 302 to $T_D = T_i/4$.

However, if this delay circuit is arranged with a semiconductor integrated circuit, then, as shown in Table 1, depending on power voltage $V_{DD}$, ambient temperature $T_a$ and the manufacturing condition of the transistor (threshold voltage: $V_{TP}$, $V_{TN}$), delay time $T_D$ causes errors of approximately $-50\%$ to $+100\%$ relative to its design value.

Figure 3:
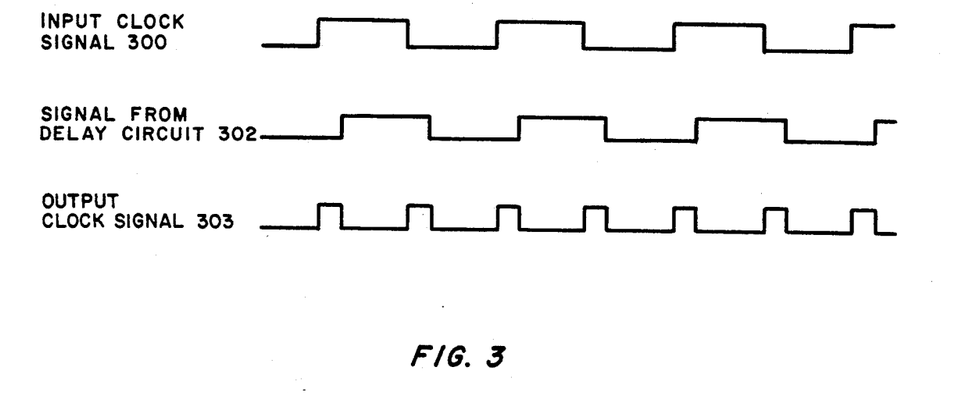
FIG. 3 is a timing chart for each signal when, in the frequency multiplier of FIG. 1, the duty factor of the output clock signal changes by $-50\%$.
Figure 4:
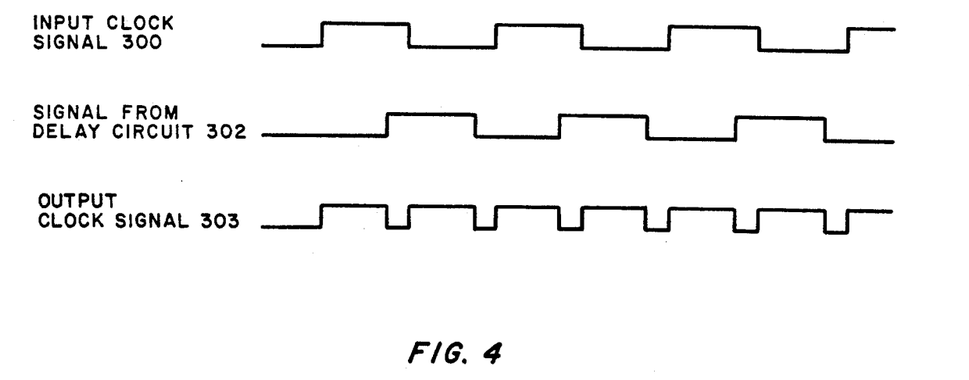
FIG. 4 is a timing chart for each signal when, in the frequency multiplier of FIG. 1, the duty factor of the output clock signal changes by $+50\%$.

Accordingly, if the frequency multiplier is designed with the circuit arrangement of FIG. 1, then the duty factor of the waveform of the output clock signal is changed as shown in FIGS. 3 and 4.

FIG. 3 shows an output waveform when delay time $T_D$ changes by $-50\%$, and FIG. 4 shows an output waveform when the delay time changes by $+50\%$. If delay time $T_D$ changes by $+100\%$, the output waveform remains fixed to the high level.

Therefore, if such an output clock signal is externally used, then a drawback results in that the multiplier malfunctions due to the fluctuation of the duty factor.

SUMMARY OF THE INVENTION

Accordingly, an object of the present invention is to provide a frequency multiplier which restricts the fluctuating range of the duty factor of the output clock signal to within a predetermined permissible range by inhibiting the output clock signal when the duty factor changes and exceeds the permissible range due to the above factors so that any malfunction of the peripheral circuit, which operates with this signal used as the system clock, can be eliminated.

In order to achieve this end, the present invention, which can generate an output clock signal of multiplied frequency by an input clock signal and a clock signal obtained by delaying the input clock signal via a first delay circuit, comprises:

at least one delay circuit cascaded to the first delay circuit;

monitoring means for emitting a signal when the duty factor of the output clock signal exceeds a predetermined range by monitoring how the delay time of the delay circuit changes according to the change of the external conditions, with the input clock signal and the output of the cascaded delay circuit entered; and blocking means for blocking the output clock signal when the signal from the monitoring means is entered.

According to one preferred embodiment of the present invention, second and third delay circuits are successively cascaded to the first delay circuit, and the monitoring means comprises first monitoring means for emitting a signal when the rise of the output of the third delay circuit becomes faster than the fall of the input clock signal, and second monitoring means for emitting a signal when the rise of the output of the second delay circuit is delayed longer than the fall of the input clock signal.

Further, according to another preferred embodiment of the invention, a fourth delay circuit is cascaded to the first delay circuit, and the monitoring means emits its signal when the rise of the output of the fourth delay circuit becomes faster than the fall of the input clock signal, or when the rise of the output of the fourth delay circuit is delayed longer than the rise of the input clock signal.

Thus, the output clock signal is blocked by the blocking means when the output signal from the monitoring means enters the blocking means, and the output signal with an excessive duty factor is avoided so that the peripheral circuit does not malfunction.

The above object, features and advantages of the present invention will become apparent from the following description when taken in conjunction with the accompanying drawings which illustrate preferred embodiments of the present invention by way of example.

BRIEF DESCRIPTION OF THE DRAWINGS

The present invention is hereinafter described in greater detail with reference to the accompanying drawings in which.

DETAILED DESCRIPTION OF THE PREFERRED EMBODIMENTS

First, the arrangement of one specific embodiment according to the present invention is described with reference to FIG. 5.

Delay circuit 102 is intended to delay input clock signal 100 and exclusive NOR circuit 107 outputs a clock signal to NOR circuit 112 multiplied in frequency by two inputs: directly entered input clock signal 100 and input clock signal 100' delayed via delay circuit 102. Delay circuits 103 and 104 are successively cascaded to delay circuit 102 for the timing purpose so that, when the delay time of each delay circuit 102 through 104 becomes longer, the former can stop output clock signal 109 while, when these delay times become shorter, the latter can stop the output clock signal 109. Each of flip-flops 105 and 106 use input clock signal 100 or its inverted signal and the output signal of delay circuit 104 as their input, and cooperate to emit a set signal from flip-flop 106 when the delay time of the output signal of delay circuit 104 becomes shorter than a predetermined limit relative to input clock signal 100. Flip-flops 107 and 108 use input clock signal 100 and the output signal or its inverted signal of delay circuit 103 as their input, and cooperate to emit a set signal from flip-flop 108 when the delay time of the output signal of delay circuit 103 becomes longer than a predetermined limit relative to input clock signal 100. Flip-flop 111 uses reset signal 110 and the output signals of flip-flops 106 and 108 as three inputs, and is reset by reset signal 110 while being set by the set signal from flip-flop 106 or 108. NOR circuit 112 inputs the outputs of exclusive NOR circuit 101 and flip-flop 111 and stops or emits multiplied output clock signal 109 according to whether the level of the signal from flip-flop 111 is high or low.

Next, the operation of this embodiment is described with reference to each timing chart, assuming that the cycle of input clock signal 100 is $T_i$, the design values of the delay times of delay circuits 102, 103 and 104 relative to input clock signal 100 are $T_{D1}$, $T_{D2}$ and $T_{D3}$, respectively ($T_{D3} > T_{D2} > T_{D1}$), and the duty factor of output clock signal 109 equals 50% as described in the prior art.

Figure 6:
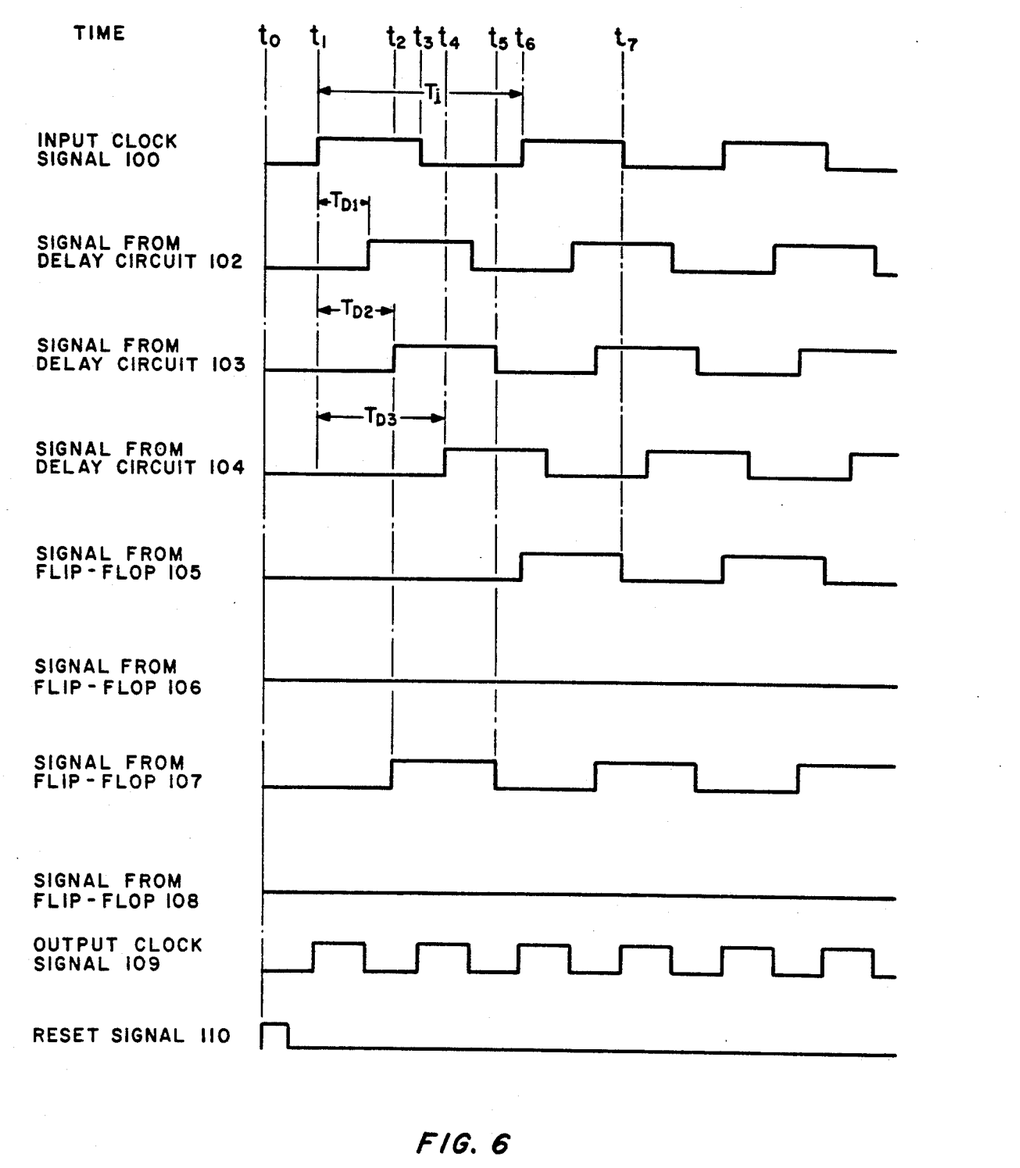
FIG. 6 is a timing chart illustrating the process of each signal when, in the embodiment of FIG. 5, the duty factor of the output clock signal is 50% under normal operation.

First, a normal frequency multiplication is described with reference to FIG. 6. Delay time $T_{D3}$ of delay circuit 104 is set so that the rise of the output signal of delay circuit 104 (time $t_4$) does not become faster than the fall of input clock signal 100 (time $t_3$), and delay time $T_{D2}$ of delay circuit 103 is set so that the rise of the output signal of delay circuit 103 (tmie $t_2$) does not become more delayed than time $t_3$. At time $t_0$, single pulse reset signal 110 enters to reset each signal, and subsequently, input clock signal 100 enters. Flip-flop 105 is set when input clock signal 100 and the output of delay circuit 104 are both at the "H" level (time $t_6$), and is reset when they are both at the "L" level (time $t_7$). In consequence, although the setting signal enters flip-flop 106 while input clock signal 100 is at the "L" level and the output of the delay circuit 104 is at the "H" level (time $t_4$ − time $t_6$), since an "H" level signal enters the reset side from flip-flop 105 via inverter 113, flip-flop 106 cannot be set at all. Likewise, flip-flop 107 is set when input clock signal 100 and the output of delay circuit 103 are both at the "H" level (time $t_2$), and is reset when they are both at the "L" level (time $t_5$). Therefore, although the setting signal enters flip-flop 108 while input signal 100 is at the "H" level and the output of delay circuit 103 is at the "L" level (time $t_1$–$t_2$), since the "H" level signal enters to the resent side from flip-flop 107 via inverter 114, flip-flop 108 cannot be set. As a result, flip-flop 111 keeps its reset state, and output clock signal 109 multiplied in frequency is emitted from NOR circuit 112.

Figure 7:
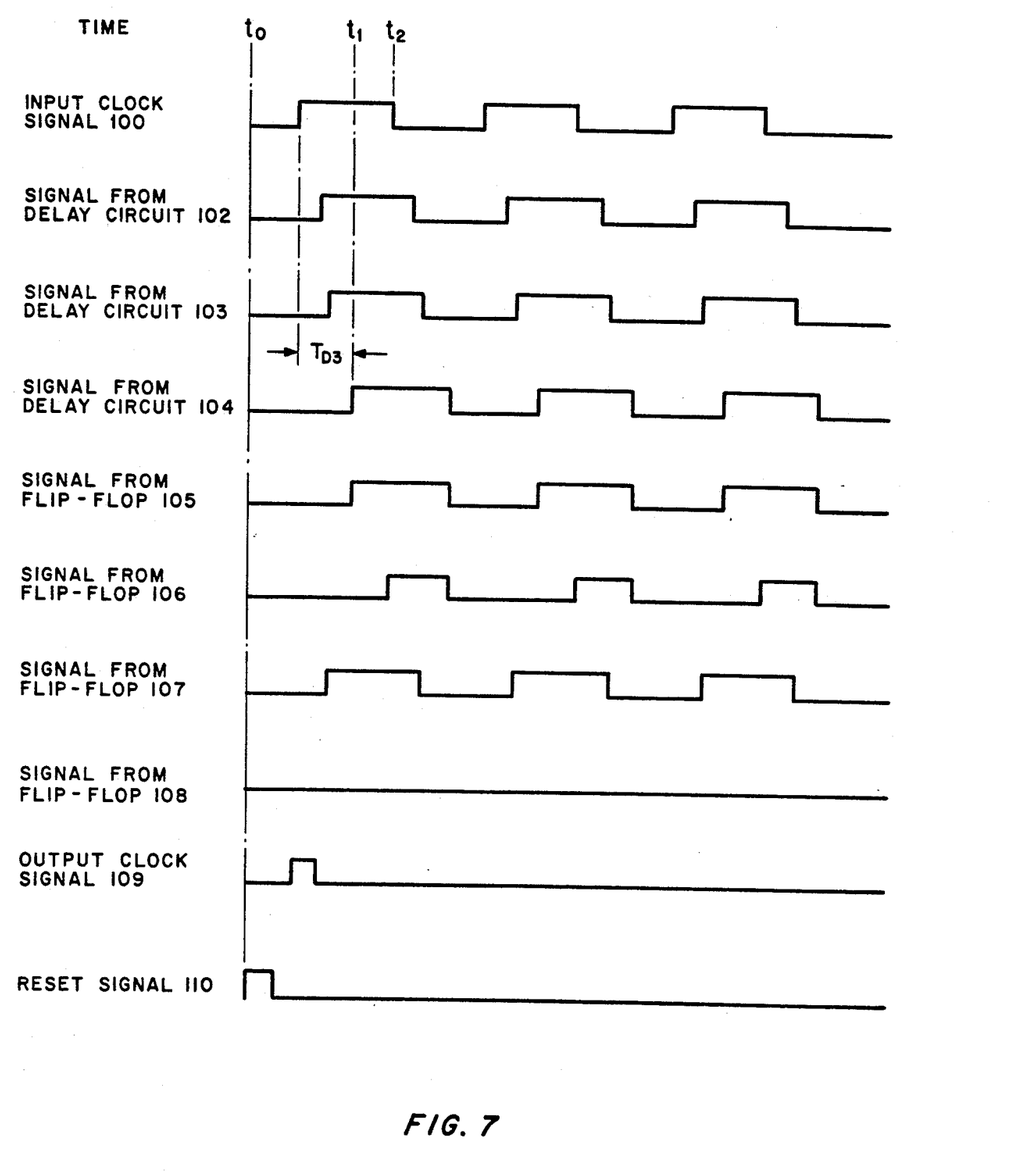
FIG. 7 is a timing chart illustrating the process of each signal when, in the embodiment of FIG. 5, the delay time of each delay circuit becomes shorter and the output clock signal is stopped.

Next, if, as shown in FIG. 7, delay time $T_{D3}$ becomes shorter, and the rise of the output signal of delay circuit 104 (time $t_1$) becomes faster than the fall of input clock signal 100 (time $t_2$), then a signal for setting flip-flop 106 enters while the "H" level signal is being emitted from flip-flop 105 (i.e., the "L" level signal is entering the reset side of flip-flop 106 via inverter 113) to set flip-flop 106 (time $t_2$). In consequence, this signal causes flip-flop 111 to be set, which output in turn causes NOR circuit 112 to block output clock signal 109.

Figure 8:
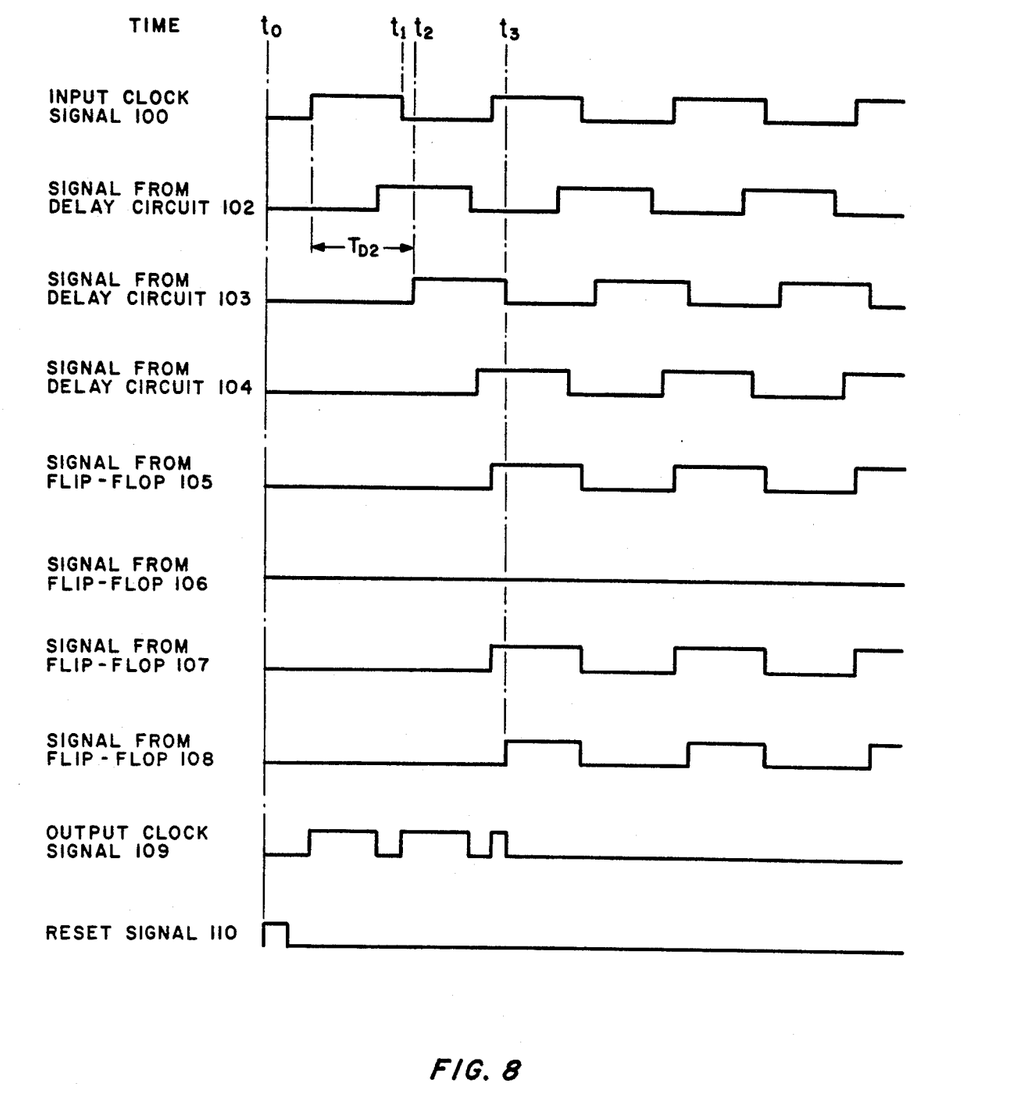
FIG. 8 is a timing chart illustrating the process of each signal when, in the embodiment of FIG. 5, the delay time of each delay circuit becomes longer and the output clock signal is stopped.

Next, if, as shown in FIG. 8, delay time $T_{D2}$ becomes longer, and the rise of the output signal of delay circuit 103 (time $t_2$) becomes more delayed than the fall of input clock signal 100 (time $t_1$), then a signal for setting flip-flop 108 enters from flip-flop 107 (i.e., the "L" level signal enters the resent side of flip-flop 108 via inverter 114) to set flip-flop 108 (time $t_3$). As a result, this signal causes flip-flop 111 to be set, which output in turn causes NOR circuit 112 to block output clock signal 109.

Now, the relationship between delay times $T_{D2}$ and $T_{D3}$ and the duty factor D of output clock signal 109 is hereinafter described. However, since this type of semiconductor integrated circuit causes changes of its characteristics caused by manufacturing conditions, applied voltage, frequency and temperature to become uniform by making the positions of each delay circuit on the IC close to each other, it can be assumed that the fluctuating factors of delay times $T_{D1}$, $T_{D2}$ and $T_{D3}$ are equal to each other.

Since duty factor D of output clock signal 109 is defined by the ratio of delay time $T_{D1}$ of delay circuit 102 to the cycle of output clock signal 109 ($=T_i/2$), duty cycle D can be expressed as follows:

$$D = T_{D1}/T_i/2 = 2T_{D1}/T_i \qquad (1)$$

Next, it is not until the rise of the output of delay circuit 104 becomes faster than the fall of the input clock signal 100 that the output clock signal 109 is blocked as the delay time becomes shorter. Therefore, assuming the instant delay time to be $aT_{D3}$ ($a < 1$), the following formula needs to be met in order for output clock signal 109 to be normally emitted:

$$aT_{D3} > T_i/2 \qquad (2)$$

Further, it is not until the rise of the output of delay circuit 103 becomes more delayed than the fall of input clock single 100 that output clock signal 109 is blocked as the delay time becomes longer. Therefore, assuming the instant delay time to be $bT_{D2}$ (b>1), the following formula needs to be met in order for output clock signal 109 to be normally emitted:

$$bT_{D2} < T_i/2 \quad (3)$$

Since delay time $T_{D1}$ changes with the same fluctuating factor as those of delay times $D_2$ and $D_3$, duty factor D can be expressed according to the following formulae for each case in which the delay time becomes shorter or longer, using formula (1):

$$D = 2aT_{D1}/T_i \quad (4)$$

$$D = 2bT_{D1}/T_i \quad (5)$$

From formulae (2), (3), (4) and (5), a formula (6) can be obtained as follows:

$$T_{D1}/T_{D2} > D > T_{D1}/T_{D3} \quad (6)$$

Formula (6) represents the permissible range of duty factor D of output clock signal 109. Incidentally, when duty factor D is designed to equal 50%, since $T_{D1} = T_i/4$, $$T_i/4T_{D2} > D > T_i/4T_{D3}$$

Therefore, by properly setting delay time $T_{D3}$ and $T_{D2}$, a duty factor exceeding the permissible range an be avoided.

Next, the arrangement of a second embodiment of the invention is described with reference to FIG. 9.

Figure 5:
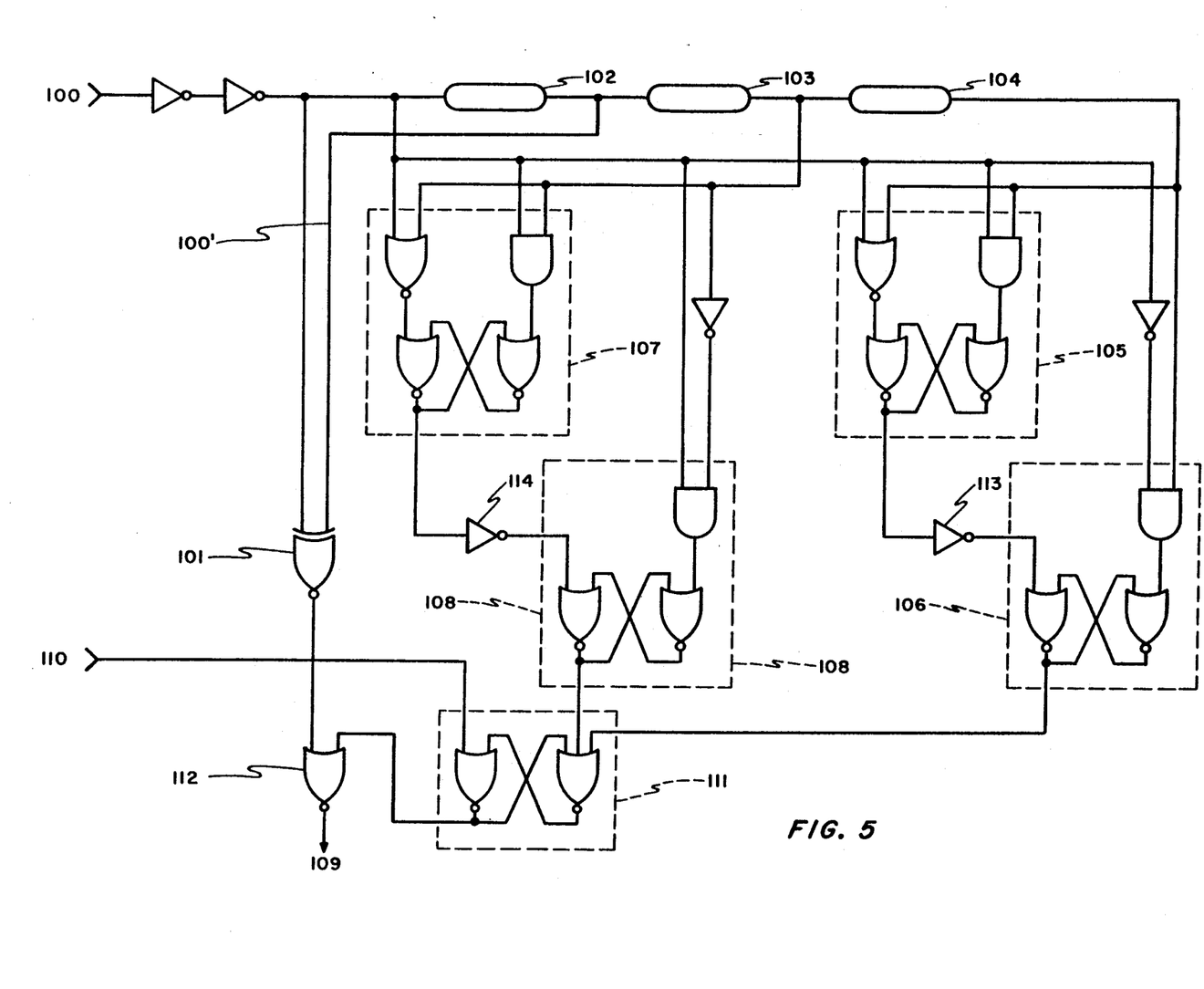
FIG. 5 is a circuit diagram illustrating the arrangement of a specific embodiment of the frequency multiplier according to the present invention.

This embodiment is equivalent to a circuit in which delay circuit 103 and flip-flops 107 and 108 f FIG. 5 embodiment are eliminated, and delay circuits 102 and 104 are connected with other components left completely the same.

Figure 10:
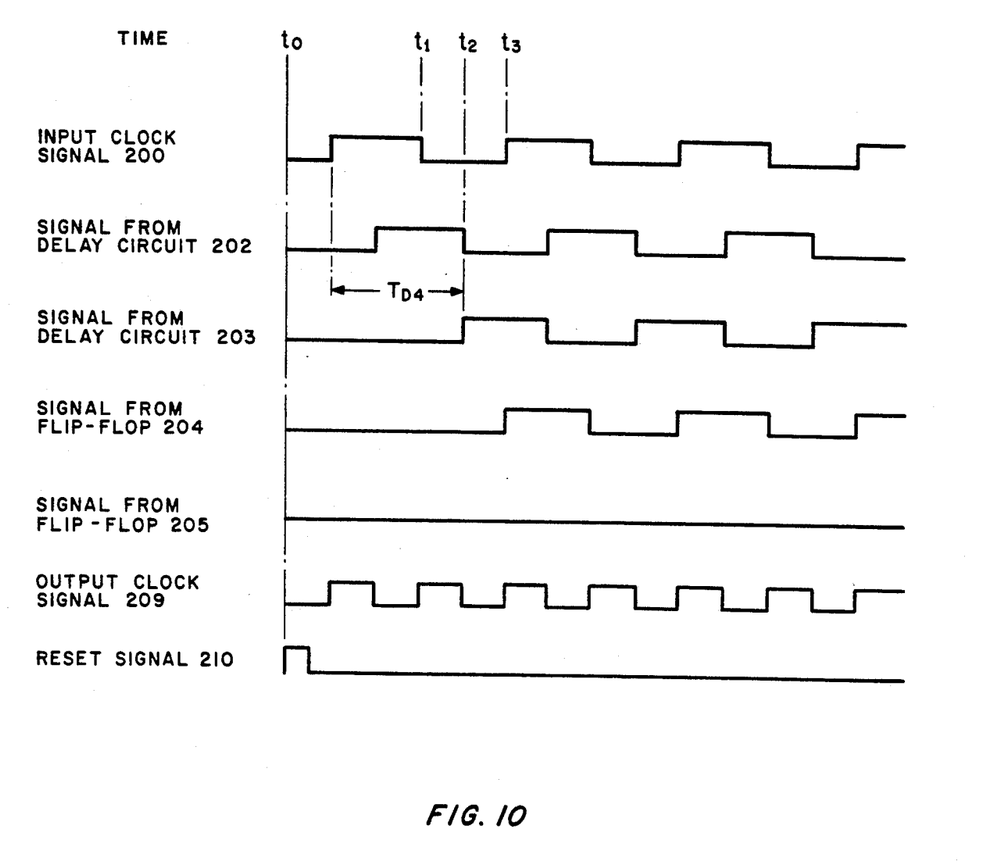
FIG. 10 is a timing chart illustrating the process of each signal when, in the embodiment of FIG. 9, the duty factor of the output clock signal equals 50% under normal operation.

In normal operation as shown in FIG. 10, delay time $T_{D4}$ of delay circuit 203 is set so that the rise of the output signal of delay circuit 203 occurs in the "L" level range (time $t_1$–$t_3$) of input clock signal 200.

When input clock signal 200 and the output signal of delay circuit 203 are both at the "H" level, flip-flop 204 is set, and is reset when they are both at the "L" level. While clock signal 200 is at the L" level and the output of delay circuit 203 is at the "H" level (time $t_2$–$t_3$), a set signal enters flip-flop 205, but, since the "H" level signal enters the reset side from flip-flop 204 via inverter 208, flip-flop 205 cannot be set.

Figure 11:
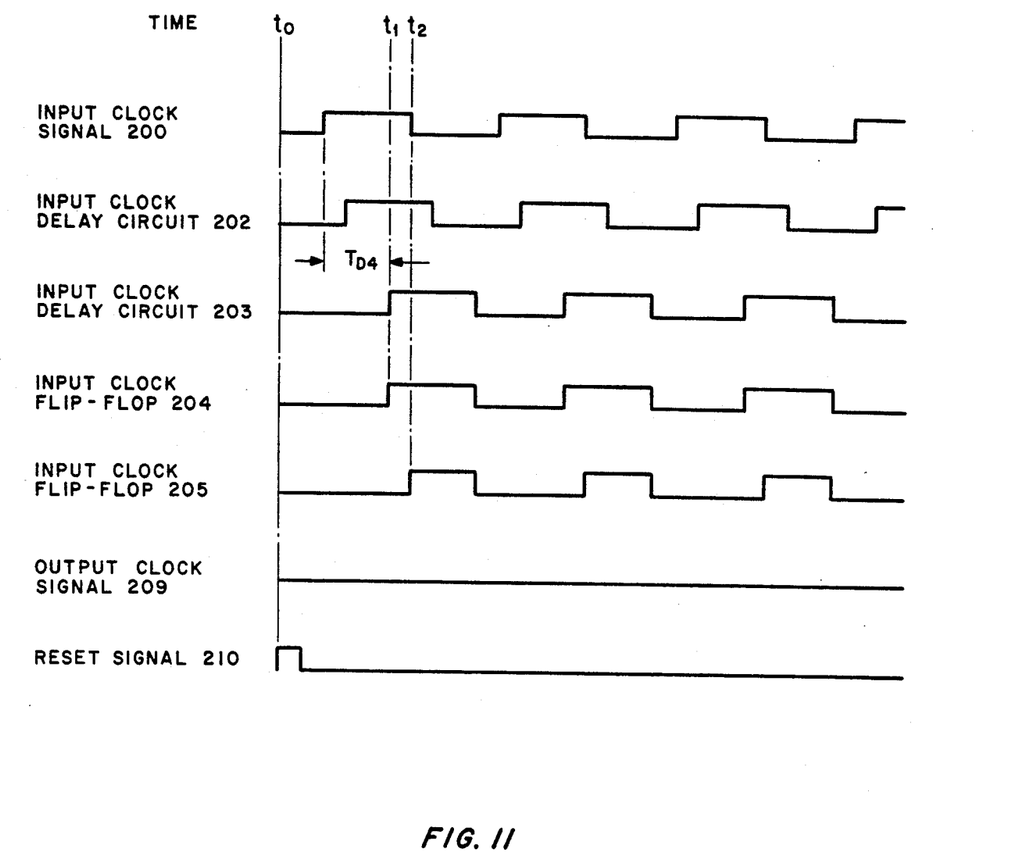
FIG. 11 is respectively a timing chart illustrating the process of each signal when, in the embodiment of FIG. 9, the delay time of each delay circuit becomes shorter and the output clock signal is stopped.

Next, as shown in FIG. 11, if the delay time $T_{D4}$ becomes shorter and the rise of its output clock signal (time $t_1$) becomes faster than the fall of input clock signal 200 (time $t_2$), then, while the "H" level signal is emitted from flip-flop 204 (i.e., the "L" level signal enters the reset side of flip-flop 205 via inverter 208), a signal for setting flip-flop 205 enters to set flip-flop 205 (time $t_2$). Therefore, this signal causes flip-flop 206 to be set, which output in turn causes NOR circuit 207 to block output clock signal 209.

Figure 12:
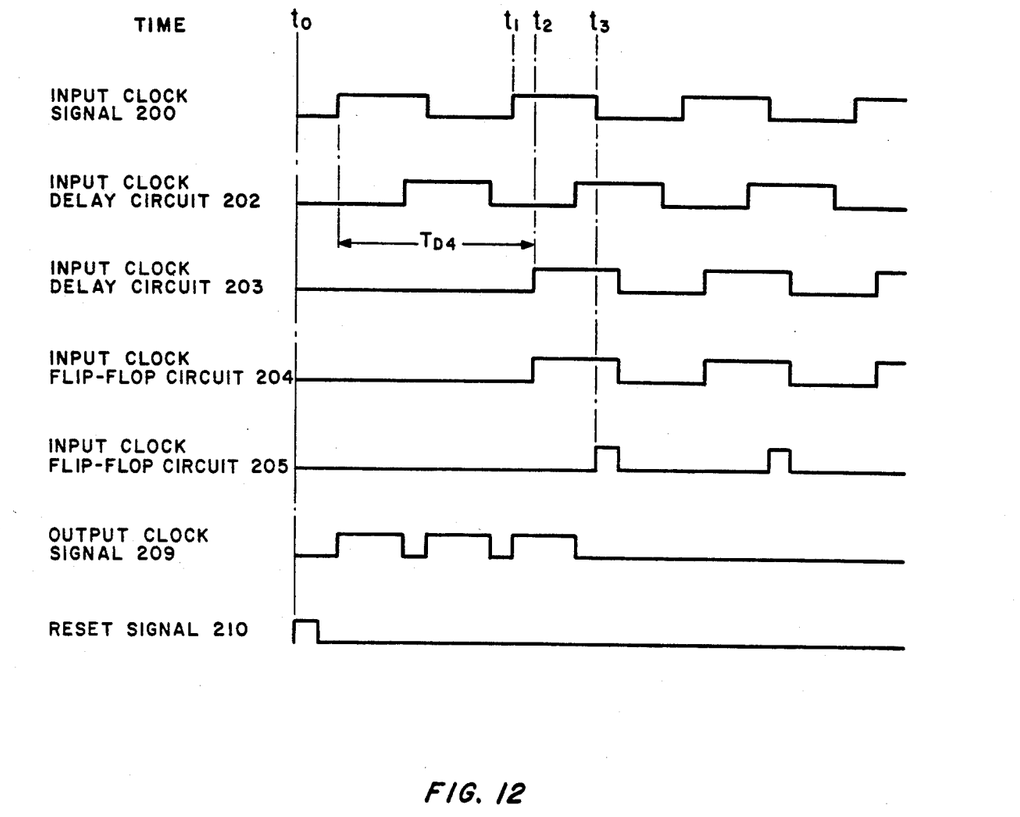
FIG. 12 is a timing chart illustrating the process of each signal when, in the embodiment of FIG. 9, the delay time of each delay circuit becomes longer and the output clock signal is stopped.

Next, as shown in FIG. 12, if the delay time $T_{D4}$ becomes longer and the rise of the output signal (time $t_2$) becomes more delayed than the rise of input clock signal 200 (time $t_1$), then, similarly, while the "L" level signal enters the reset side from flip-flop 205, a signal for setting flip-flop 205 enters to set flip-flop 205 (time $t_3$). In consequence, this signal causes flip-flop 206 to be set, which output in turn causes NOR circuit 207 to block output clock signal 209.

Further by a similar calculation as in the first embodiment, the permissible range of duty factor D of output clock signal 209 can be given as:

$$2T_{D1}/T_{D4} > D > T_{D1}/T_{D4}$$

If D=50%, then it can be defined by:

$$T_i/2T_{D4} > D > T_i/4T_{D4}$$

As described above, according to the present invention, the permissible range of the change of the delay time, which is caused by fluctuations in power voltage and other factors, is determined by properly setting the delay time of the delay circuit, and if the delay time is changed so that it exceeds that permissible range, then the output clock signal can be stopped to prevent its duty factor from extremely degrading and causing a malfunction of the peripheral circuit, which utilizes this signal as a system clock.

Figure 9:
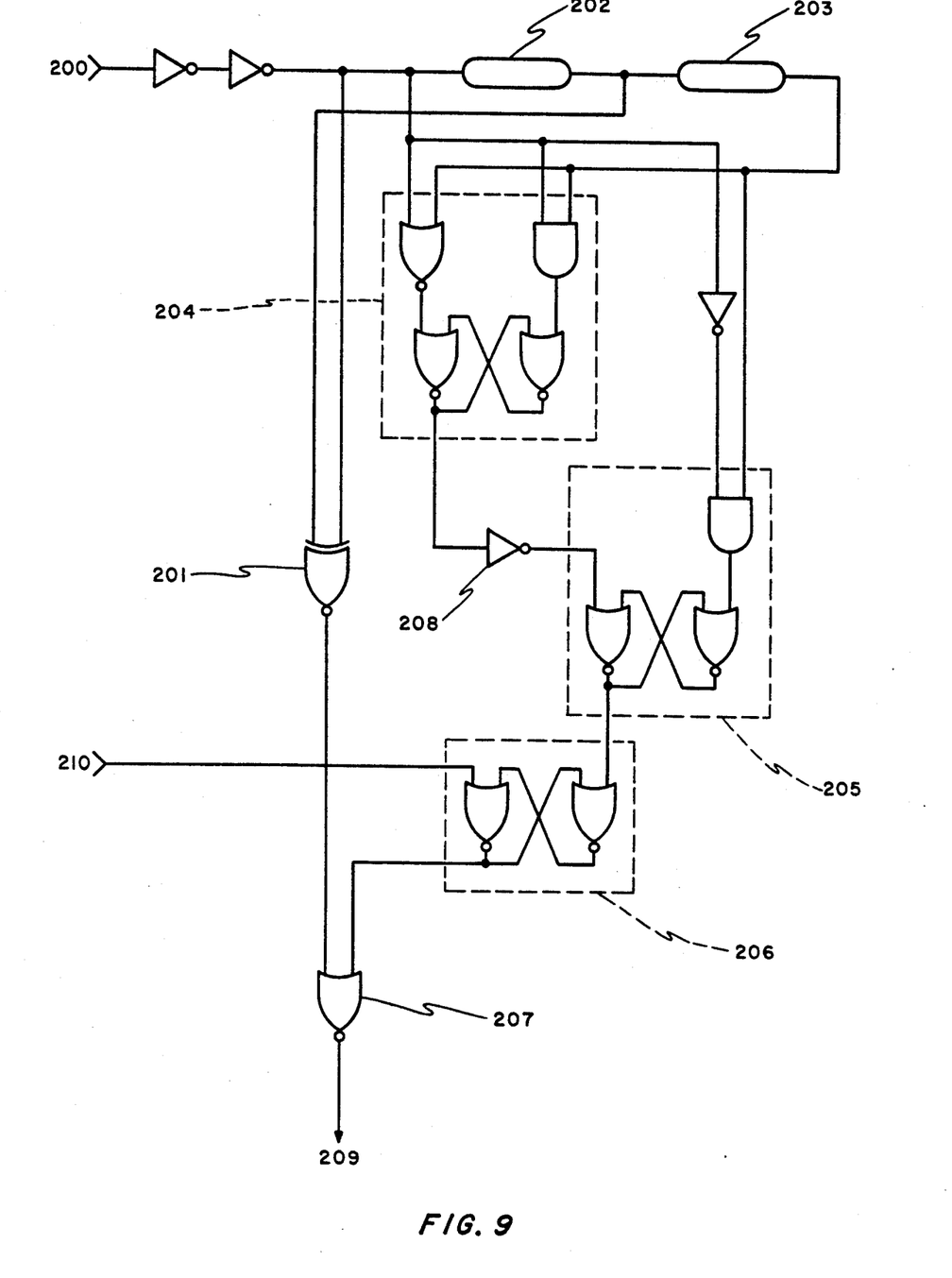
FIG. 9 is a circuit diagram illustrating the arrangement of another embodiment of the frequency multiplier according to the present invention.

In addition, the embodiment of FIG. 5 allows the upper and lower limits of the permissible range of duty factor D to be set independently of each other, while the second embodiment of FIG. 9 allows the circuit size to be made smaller.

Although some specific embodiments of the present invention have been shown and described in detail, it should be understood that various changes and modifications may be made therein without departing from the spirit and scope of the appended claims.

TABLE 1

| Design Value | MIN ($V_{DD}$ = 6.0 V) | TYP ($V_{DD}$ = 5.0 V) | (in usec) MAX ($V_{DD}$ = 4.0 V) | Simulating Condition |
|---|---|---|---|---|
| 1.0 | | | | |
| $t_r$ | 0.485 | 1.005 | 2.070 | $T_a$ = −40°∼100° |
| | | | | $V_{TN}$ = 0.4∼1.0 |
| $t_f$ | 0.485 | 1.005 | 2.090 | $T_{TP}$ = 0.5∼1.1 |

$t_r$: delay time when signal rises
$t_f$: delay time when signal falls
$T_a$: ambient temperature (°C.)
$T_{TN}$: threshold voltage (V) for N-channel transistor
$T_{TP}$: threshold voltage (V) for P-channel transistor

What is claimed is:

1. A frequency multiplier for generating an output clock signal of a multiplied frequency responsive to an input clock signal and a clock signal obtained by delaying the input clock signal via a delay circuit, the improvement being that said frequency multiplier has:
   delay means comprising a plurality of cascaded delay stages forming said delay circuit;

monitoring means for receiving an input clock signal and an output from said plurality of delay stages said delay means in order to monitor the change of the delay time of said delay means according to the change of the external conditions, and for emitting a signal when the delay time of said delay means exceeds a predetermined range; and blocking means for receiving said output clock signal of multiplied frequency from a first stage of said plurality of delay stages and said signal emitted from said monitoring means and for stopping said output clock signal of multiplied frequency whenever said exceeded predetermined range signal is emitted from said monitoring means.

2. A frequency multiplier as set forth in claim 1, wherein a final one of said plurality of delay stages of said delay means comprises means for connecting said final delay stage to said monitoring means which together with said input clock signal emits a signal when the rise of the output of said final delay stage becomes faster than the fall of said clock signal, or becomes more delayed than the rise of said input clock signal.

3. A frequency multiplier as set forth in claim 2 wherein, when the delay times of said first and final stages delay circuits are assumed to be $T_{D1}$ and $T_{D4}$, respectively, the permissible range of the duty factor D of said output clock signal lies within the range of:

$$2T_{D1}/T_{D4} > D > T_{D1}/T_{D4}$$

4. A frequency multiplier for generating an output clock signal of a multiplied frequency responsive to an input clock signal and a clock signal obtained by delaying the input clock signal via a first delay circuit, the improvement being that said frequency multiplier has:

delay means comprising first, second, and third cascaded delay circuits;

monitoring means comprising first monitoring means for receiving said input clock signal and the output of said third delay circuit and for emitting a signal when the rise of the output of said third delay circuit becomes faster than the fall of said input clock signal, second monitoring means for receiving said input clock signal and the output of said second delay circuit and for emitting a signal when the rise of said second delay circuit becomes more delayed than the fall of said input clock signal; and blocking means for receiving said output clock signal of multiplied frequency and said signals emitted from said first and second monitoring means, respectively, and for stopping said output clock signal of multiplied frequency when either of said signals from said first and second monitoring means is received.

5. A frequency multiplier as set forth in claim 4 wherein, when the delay times of said first, second and third delay circuits are assumed to be $T_{D1}$, $T_{D2}$ and $T_{D3}$, respectively, the permissible range of the duty factor D of said output clock signal lies within the range of:

$$T_{D1}/T_{D2} > D > T_{D1}/T_{D3}.$$

* * * * *